(12) United States Patent
Xiao (10) Patent No.: US 12,096,627 B2
(45) Date of Patent: Sep. 17, 2024

(54) STACKED NEURAL DEVICE STRUCTURE AND MANUFACTURING METHOD THEREOF

(71) Applicant: SiEn (QingDao) Integrated Circuits Co., Ltd, Shandong (CN)

(72) Inventor: Deyuan Xiao, Shandong (CN)

(73) Assignee: SiEn (QingDao) Integrated Circuits Co., Ltd, Qingdao (CN)

( * ) Notice: Subject to any disclaimer, the term of this patent is extended or adjusted under 35 U.S.C. 154(b) by 978 days.

(21) Appl. No.: 17/091,356

(22) Filed: Nov. 6, 2020

(65) Prior Publication Data

US 2021/0167075 A1    Jun. 3, 2021

(30) Foreign Application Priority Data

Nov. 29, 2019    (CN) .......................... 201911204781.5

(51) Int. Cl.
H10B 41/40    (2023.01)
G06N 3/063    (2023.01)

(52) U.S. Cl.
CPC ............. H10B 41/40 (2023.02); G06N 3/063 (2013.01)

(58) Field of Classification Search
CPC ........ H10B 41/40; H10B 41/00; H10B 41/10; G06N 3/063; H01L 29/7881;
(Continued)

(56) References Cited

U.S. PATENT DOCUMENTS 5,587,668 A    12/1996    Shibata et al.
11,398,490 B2*    7/2022    Xiao ................. H01L 29/66439
(Continued)

FOREIGN PATENT DOCUMENTS

CN    102237314 A    11/2011
CN    106684123 A    5/2017
CN    108258044 A    7/2018

OTHER PUBLICATIONS

Machine translation of CN108258044 (Year: 2016).*
Chinese Office Action, dated Jun. 6, 2022 in a counterpart Chinese patent application, No. CN 201911204781.5.
(Continued)

Primary Examiner — Allison Bernstein
(74) Attorney, Agent, or Firm — Chen Yoshimura LLP (57) ABSTRACT

This invention provides a stacked neuron device structure and a manufacturing method thereof. The device comprises: a substrate with peripheral circuits in the substrate; a barrier layer; a neuron transistor array, comprising a plurality of neuron transistors arranged in an array, wherein the transistor comprises a semiconductor channel, a modulation stack, and a gate array; the two ends of the semiconductor channel are respectively connected to peripheral circuits, and the peripheral circuit is used to control the gating or closing of the corresponding neuron transistor. The first dielectric layer, the weighting floating gate layer and the second dielectric layer are stacked in this order. The gate array is located on the modulation stack and is used to modulate the potential of the weighting floating gate to realize the weighting of the weight floating gate. The invention realizes a structure and manufacturing method of a junctionless neuron device arranged in an array on a plane and vertically stacked in the longitudinal direction. The on and off of each neuron transistor is controlled by the peripheral circuit in the substrate, which greatly improves the packing density of the neuron devices.

12 Claims, 6 Drawing Sheets

(58) Field of Classification Search
CPC ............. H01L 27/0688; H01L 21/8221; H01L 29/42324; H01L 29/7831; H01L 29/788
See application file for complete search history.

(56) References Cited

U.S. PATENT DOCUMENTS

| | | | | |
|---|---|---|---|---|
| 2006/0108627 | A1* | 5/2006 | Choi ..................... | H10B 69/00 257/314 |
| 2011/0255334 | A1 | 10/2011 | Grossi et al. | |
| 2023/0169317 | A1* | 6/2023 | Choi ..................... | H10B 43/35 706/26 |

OTHER PUBLICATIONS

Chinese Office Action, dated Nov. 3, 2022 in a counterpart Chinese patent application, No. CN 201911204781.5.

* cited by examiner

STACKED NEURAL DEVICE STRUCTURE AND MANUFACTURING METHOD THEREOF

CROSS-REFERENCE TO RELATED APPLICATIONS

This application claims priority to P.R.C. Patent Application No. 201911204781.5 titled "A stacked neuron device structure and manufacturing method thereof," filed on Nov. 29, 2019, with the State Intellectual Property Office of the People's Republic of China (SIPO).

TECHNICAL FIELD

The present disclosure relates to the field of semiconductor design and manufacturing, and particularly relates to a stacked neuron device structure and a manufacturing method thereof.

BACKGROUND

With the development of integrated circuits and the improvement of their integration, traditional silicon integrated circuits based on the function of a single transistor have encountered many difficult and urgent problems to be solved. The so-called neuron transistor (or neuMOS) as an unit transistor with powerful functions, which provides an effective way to solve the problems caused by the increase in the number of transistors and interconnections in integrated circuits.

Neuron devices are functionally equivalent to the neuron cells (neurons) that make up the human brain, eyes and other parts to realize information transmission through circuits. Specifically, a neuron device can separately weighting multiple input signals, and when the addition result of the weighted signals reaches a threshold, a predetermined signal is output. This way of weighting the input signal of the neuron device is realized by the neuron transistor in it. The neuron transistor has a gate structure of multiple input electrodes. When the sum of the input voltages of the multiple input gates reaches a predetermined value, the source and the drain will be connected. The weighting method of the neuron device is equivalent to the synapse of the neuron cell, which can be composed of a resistor and a field effect transistor, and the neuron transistor is equivalent to the cell body of this neuron cell. The summing process of the neuron transistor on the gate can use the voltage mode of the capacitive coupling effect. There is no other current except the capacitor charge and discharge current, so there is basically no power consumption.

Since 2010, due to the development of the big data industry, the amount of data has shown an explosive growth trend, and the traditional computing architecture cannot support the large-scale parallel computing needs of deep learning, so the research community has carried out a new round of technology development and application of AI chips the study. AI chip is one of the core technologies in the era of artificial intelligence, which determines the platform's infrastructure and development ecology.

The brain-like chip does not use the classic Von Neumann architecture, but is based on a neuromorphic architecture design, represented by IBM Truenorth. IBM researchers built a prototype of a neuron chip using a storage unit as a synapse, a calculation unit as a neuron, and a transmission unit as an axon. Currently, Truenorth uses Samsung's 28 nm power consumption process technology. The on-chip network composed of 5.4 billion transistors has 4096 nerve synapse cores, and the real-time power consumption is only 70 mW. Because synapses require variable weights and memory functions, IBM uses phase change non-volatile (PCM) memory technology compatible with the CMOS process to experimentally implement new synapses and accelerate the commercialization process.

SUMMARY

In light of the abovementioned problems, an object of the present disclosure is to provide a neuron device and a manufacturing method thereof, which can solve the problem of low power and reliability of the device in the prior art.

An objective of the present invention is to provide a stacked neuron device structure. The stacked neuron device structure may comprise a substrate with peripheral circuits in the substrate; a barrier layer on the substrate; a neuron transistor array on the barrier layer, comprises a plurality of neuron transistors arranged in an array; wherein the neuron transistor comprises a semiconductor channel, a modulation stack, and a gate array, and both ends of the semiconductor channel are respectively connected to the peripheral circuit, and the peripheral circuit is used to control on and off of the corresponding neuron transistor, the modulation stack is located on the semiconductor channel and comprises a first dielectric layer, a weighting floating gate layer and a second dielectric layer stacked sequentially, the gate array is located on the modulation stack, and is used to modulate the potential of the weighting floating gate to realize the weighting of the weight floating gate.

In accordance with some embodiments, the stacked neuron device structure further comprises a plurality of barrier layers and neuron transistor arrays stacked alternately, and each of the neuron transistors in the neuron transistor array is connected to the peripheral circuit, and the peripheral circuit is used to control on and off of the corresponding neuron transistor.

In accordance with some embodiments, in the neuron transistor array, a plurality of the neuron transistors are arranged in parallel, the gate electrode array comprises a plurality of gate lines, and each gate line is across to a plurality of semiconductor channels of the neuron transistors.

In accordance with some embodiments, two ends of the semiconductor channel are exposed on both sides of the modulation stack, and the two ends are connected to the peripheral circuit through a conductive via.

In accordance with some embodiments, both sides of the semiconductor channel and the modulation stack have sidewall structures.

In accordance with some embodiments, both ends of the semiconductor channel are defined as a source region and a drain region, the conductivity types of the semiconductor channel, source region and drain region are all N-type, or the conductivity types of the semiconductor channel, source region and drain region are all P type.

In accordance with some embodiments, the semiconductor channel comprises polysilicon, the weighting floating gate layer comprises polysilicon, the first dielectric layer comprises silicon dioxide, and the second dielectric layer comprises high-k dielectric material.

In accordance with some embodiments, the gate array comprises copper.

In accordance with some embodiments, the gate lines of the gate array are isolated by an ultra-low-k dielectric layer.

Another objective of the present invention is to provide a manufacturing method of a stacked neuron device structure. The manufacturing method of the stacked neuron device structure comprises the steps of: 1) providing a substrate with peripheral circuits in the substrate; 2) forming a barrier layer on the substrate; 3) sequentially forming a semiconductor layer and a modulation stack layers on the barrier layer, and etching the semiconductor layer and modulation stack layers to form a plurality of semiconductor channels and modulation stacks located on the semiconductor channels, the modulation stack comprises sequentially stacked first dielectric layer, weighting floating gate layer and second dielectric layer; 4) etching the modulation stack to expose both ends of the semiconductor channel; 5) depositing an isolation layer, and forming an array of gate windows and contact windows at both ends of the semiconductor channel in the isolation layer; 6) forming a gate array in the gate window array, and forming a connecting metal in the contact window, wherein the gate array is used to modulate the potential of the weighting floating gate to realize the weighting of the weighted floating gate, and the connection metal is connected to the peripheral circuit through a conductive via hole, and the corresponding semiconductor channel is controlled to be on and off by the peripheral circuit; and 7) repeating steps 2) to 6) to form a multilayered neuron device structure.

In accordance with some embodiments, a plurality of the semiconductor channels and modulation stacks located on the semiconductor channels are arranged in parallel in step 3), and the gate electrode array comprises a plurality of gate lines, and each gate line is across to a plurality of semiconductor channels in step 6).

In accordance with some embodiments, the method further comprises a step of forming sidewall structures in both sides of the semiconductor channels and the modulation stacks between step 4) and step 5).

In accordance with some embodiments, both ends of the semiconductor channel are respectively defined as a source region and a drain region, the conductivity types of the semiconductor channel, source region and drain region are all N-type, or the conductivity types of the semiconductor channel, source region and drain region are all P type.

In accordance with some embodiments, the semiconductor channel comprises polysilicon, the weighting floating gate layer comprises polysilicon, the first dielectric layer comprises silicon dioxide, and the second dielectric layer comprises high-k dielectric material.

In accordance with some embodiments, the isolation layer comprises an ultra-low-k dielectric layer, and the gate array comprises copper.

As described above, the stacked neuron device structure and the manufacturing method thereof of the present invention have the following beneficial effects:

The invention realizes a nerve device structure arranged in an array on a plane and vertically stacked in the longitudinal direction and a manufacturing method thereof. The on and off of each neuron transistor in the neuron device structure is controlled by the peripheral circuit in the substrate, greatly improved the integration of neural devices.

The neuron transistor adopted by the invention adopts a junctionless transistor structure, on the one hand, it can avoid the implantation steps of the source region and the drain region, greatly reducing the difficulty of the process, on the other hand, the carriers can avoid incomplete interface between the gate oxidation layer and the semiconductor channel. Most carriers in the channel moving into the semiconductor channel instead of the surface. The carriers are limited by the interface scattering, which improves the carrier mobility, reduces errors, and increases the response speed of the device.

BRIEF DESCRIPTION OF THE DRAWINGS

Exemplary embodiments will be more readily understood from the following detailed description when read in conjunction with the appended drawings, in which:

FIG. 1 to FIG. 8 are schematic diagrams of the manufacturing steps of the method for manufacturing a stacked neural device structure according to an embodiment of the present invention.

DETAILED DESCRIPTION

The embodiments of the present invention are described below by way of specific examples, and those skilled in the art can readily understand other advantages and effects of the present invention from the disclosure of the present disclosure. The present invention may be embodied or applied in various other specific embodiments, and various modifications and changes can be made without departing from the spirit and scope of the invention.

The following describes the embodiments of the present invention through specific examples, and those skilled in the art can easily understand other advantages and effects of the present invention from the contents disclosed in this specification. The present invention can also be implemented or applied through different specific embodiments. The details in this specification can also be based on different viewpoints and applications, and various modifications or changes can be made without departing from the spirit of the present invention.

For example, when describing the embodiments of the present invention, for convenience of explanation, the cross-sectional view showing the structure of the device will not be partially enlarged according to the general scale, and the schematic diagram is only an example, which should not limit the scope of protection of the present invention. In addition, the actual production should include the three-dimensional dimensions of length, width and depth.

For the convenience of description, spatial relations such as "below", "lower", "above", "upper", etc. may be used here to describe an element or the relationship between features and other elements or features. It will be understood that these spatial relationship words are intended to include other directions of elements in use or in operation than those depicted in the drawings. In addition, when a layer is referred to as being "between" two layers, it can be the only layer between the two layers, or one or more intervening layers may also be present.

In the context of the present application, a structure in which the first feature described "above" the second feature may include embodiments where the first and second features are formed in direct contact, or may include additional features formed in the first and examples between the second features, so that the first and second features may not be in direct contact.

It should be noted that the illustration provided in this embodiment only illustrates the basic concept of the present invention in a schematic manner. Therefore, the illustration only shows the components related to the present invention instead of the actual number of components, shape and dimension drawing, the type, number and ratio of each component can be changed at will during its actual implementation, and the component layout type may also be more complicated.

Figure 1:
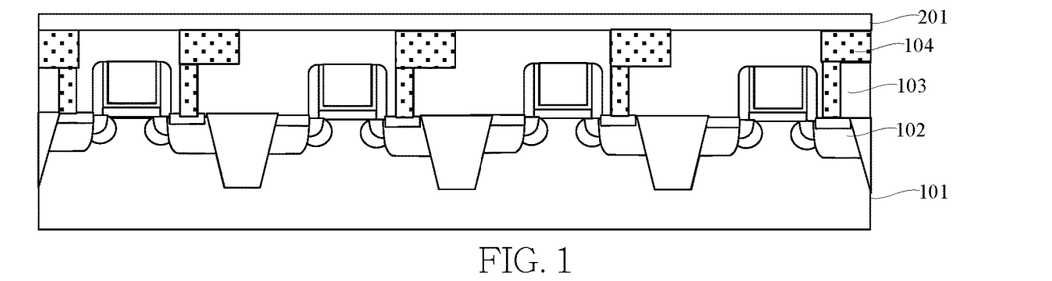

As shown in FIGS. 1-8, this embodiment provides a method for manufacturing a stacked neuron device structure. The manufacturing method comprises the following steps:

As shown in FIG. 1, step 1) is first performed to provide a substrate 101 having peripheral circuits 102 therein.

The material of the substrate 101 can be selected from monocrystalline silicon, polycrystalline silicon or amorphous silicon; the substrate 101 can also be selected from silicon, germanium, gallium arsenide or silicon germanium compounds; the substrate 101 can also be selected from having an epitaxial layer or epitaxy silicon structure on the layer; the substrate 101 may also be other semiconductor materials, which is not limited in the present invention. In this embodiment, the substrate 101 is made of silicon. The substrate 101 has a peripheral circuit 102, for example, the peripheral circuit 102 includes a plurality of peripheral devices, such as NMOS, PMOS, CMOS, diodes, triodes, capacitors, etc. The circuit structure of the corresponding functions is composed of the above peripheral devices, such as SRAM, PLL, CPU, FPGA, etc., to realize the control of the structure of stacked neuron devices.

As shown in FIG. 1, an insulating structure 103 and a conductive structure 104 in the insulating structure 103 are also formed on the substrate 101 for implementing the lead-out of the peripheral circuit 102.

As shown in FIG. 1, then step 2) is performed to form a barrier layer 201 on the substrate 101.

The barrier layer 201 is used on the one hand to isolate the semiconductor channel 202 from the conductive structure 104 underneath, on the other hand, it can prevent the diffusion of subsequently formed interconnection metals, such as copper, and improve the stability of the device. In this embodiment, the barrier layer 201 can be, but not limited to, a nitrogen-doped carbon oxide layer (NDC) or the like.

Figure 2:
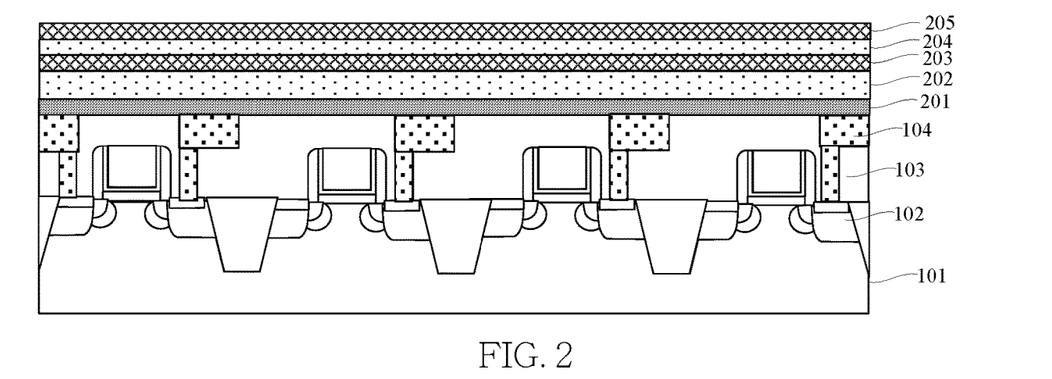
Figure 3A:
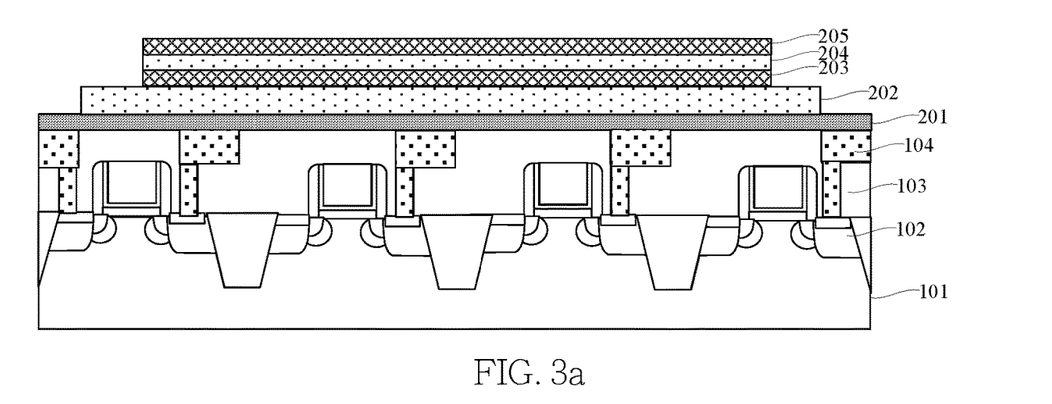
Figure 3B:
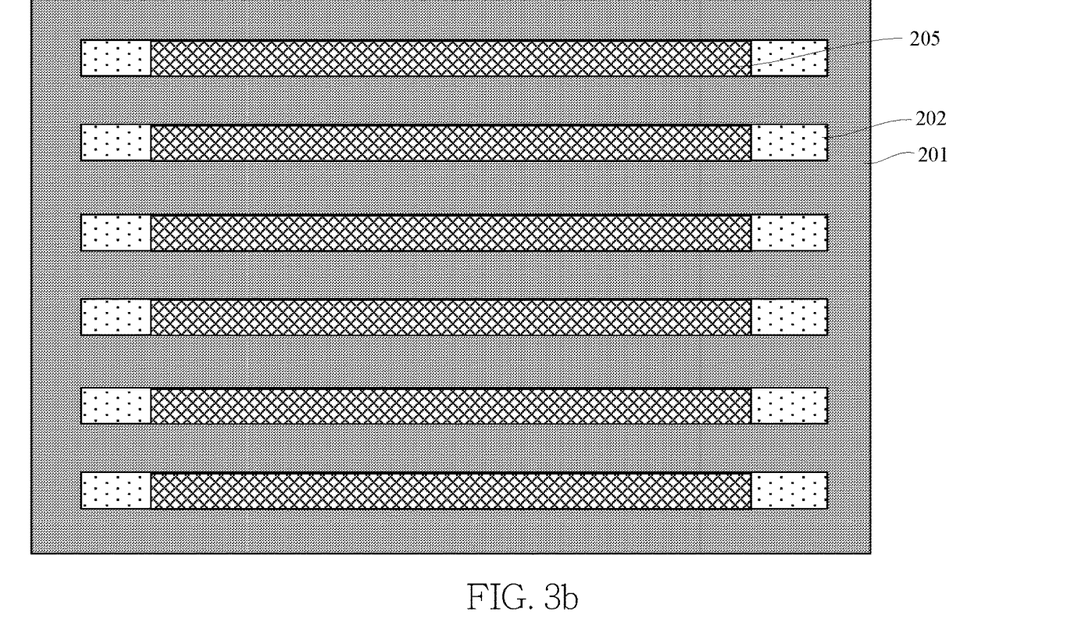

As shown in FIG. 2 to FIG. 3b, then step 3), a semiconductor layer and a modulation stack layers are sequentially formed on the barrier layer 201, and etched to form a plurality of semiconductor channels 202 and modulation stacks on the semiconductor channel 202, the modulation stack comprising a first dielectric layer 203, a weighting floating gate layer 204, and a second dielectric layer 205 that are sequentially stacked.

For example, a chemical vapor deposition process (CVD) or an atomic layer deposition process (ALD) may be used to form a semiconductor layer and a modulation stack on the barrier layer 201 in sequence, the material of the semiconductor layer includes polysilicon, and the material of the weighting floating gate layer 204 comprises polysilicon, the material of the first dielectric layer 203 comprises silicon dioxide, and the material of the second dielectric layer 205 comprises a high-k dielectric layer, and the high-k dielectric layer may be for example alumina, etc.

Next, a lithography process and a dry etching process are used to etch to form a plurality of semiconductor channels 202 and a modulation stack on the semiconductor channel 202, the plurality of the semiconductor channels 202 and a modulation stack on the semiconductor channel 202 are arranged in parallel.

As shown in FIG. 2 to FIG. 3b, step 4) is followed, and the modulation stack is etched to expose both ends of the semiconductor channel 202.

For example, a lithography process and a dry etching process may be used to etch the modulation stack to expose both ends of the semiconductor channel 202. In this embodiment, the two ends of the semiconductor channel 202 are defined as a source region and a drain region, the conductivity types of the semiconductor channel 202, the source region, and the drain region are all N-type, or the conductivity types of the semiconductor channel 202, the source region and drain region are all P-type, forming a junctionless semiconductor channel 202.

Figure 4A:
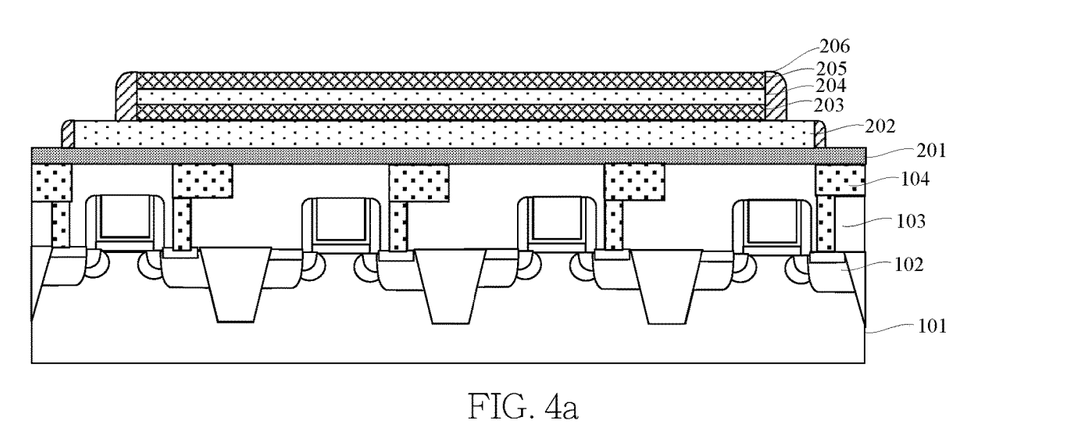
Figure 4B:
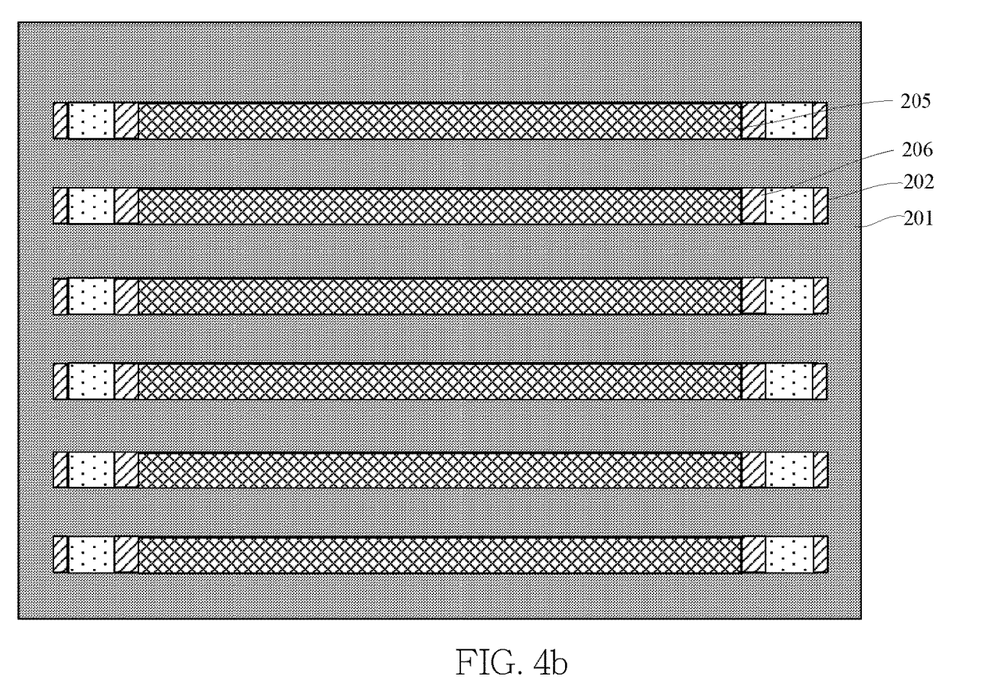

Then, as shown in FIGS. 4a and 4b, sidewall structures 206 are formed on both sides of the semiconductor channel 202 and the modulation stack. The sidewall structures 206 can prevent subsequent connection between metal and weighting floating gate layers 204 or the semiconductor channels 202.

Figure 5:
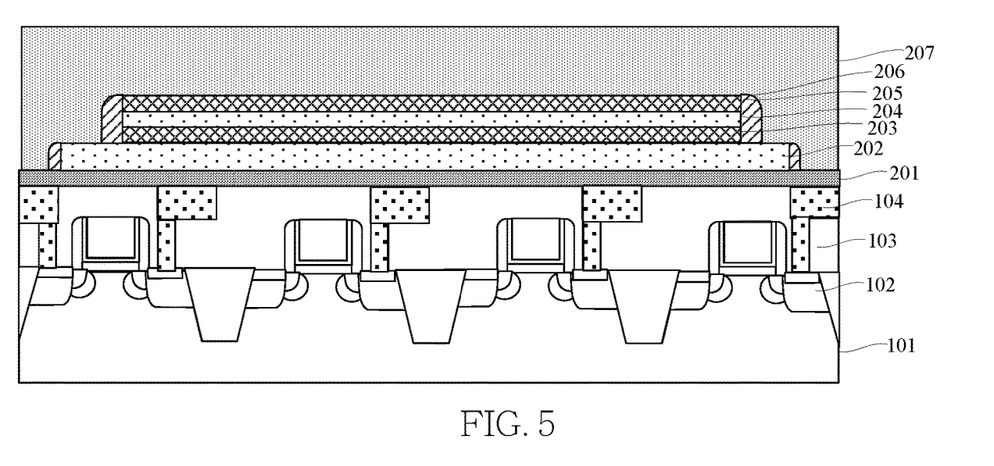
Figure 6:
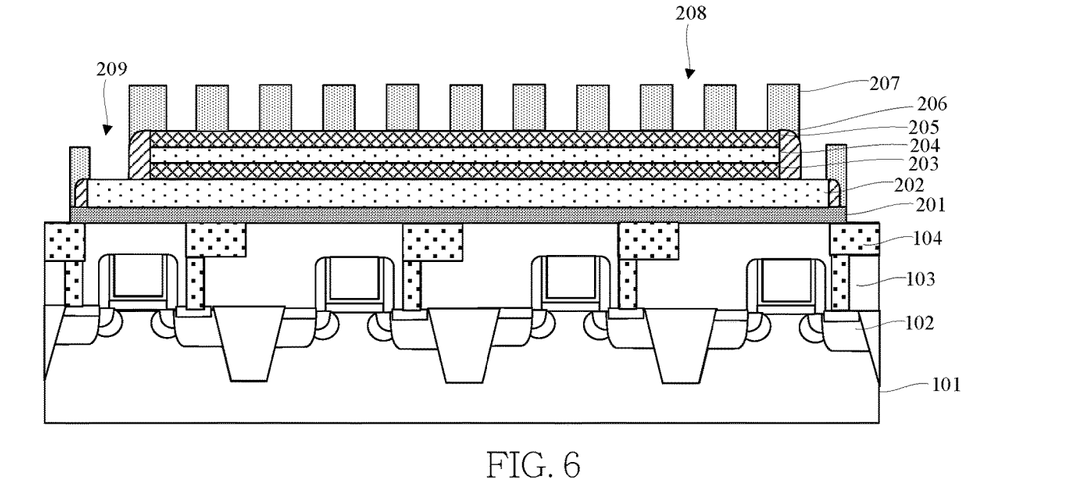

As shown in FIGS. 5-6, step 5) is followed, an isolation layer 207 is deposited, and a gate window array 208 and contact windows 209 at both ends of the semiconductor channel 202 are formed in the isolation layer. This etching can simultaneously remove part of the barrier layer 201 exposes the conductive structure 104 on the substrate 101 for subsequent interconnection between the semiconductor channel 202 and the peripheral circuit 102.

The isolation layer 207 comprises an ultra-low-k dielectric layer, and the dielectric constant of the ultra-low-k dielectric layer 207 is less than 2.5. The isolation layer uses an ultra-low-k dielectric layer 207, which can effectively reduce the capacitance value between each gate line in the subsequent gate array 210, the mutual influence between each gate line is reduced, and the accuracy of the device is improved.

Figure 7A:
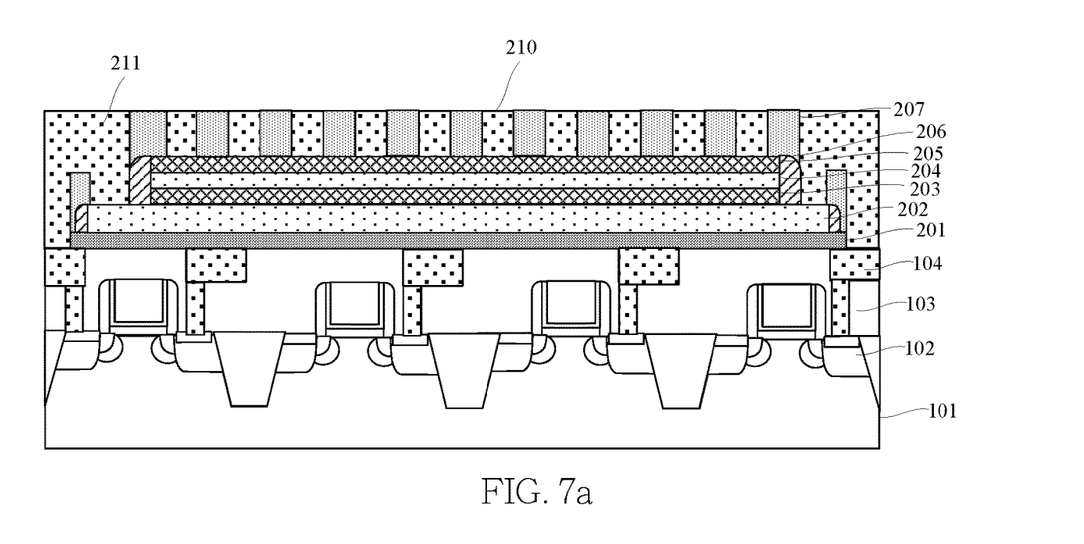
Figure 7B:
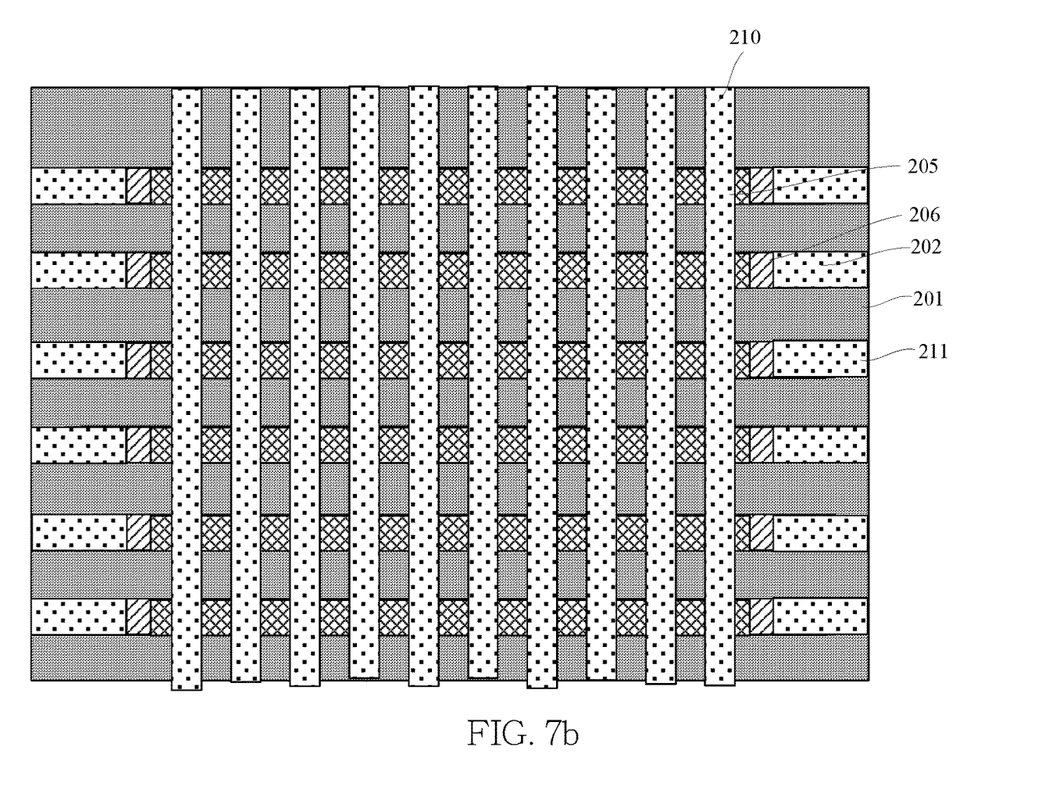

As shown in FIG. 7a to FIG. 7b, step 6) is followed, a gate array 210 is formed in the gate window array 208, an interconnection metal 211 is formed in the contact window 209, and the gate array 210 is used for the potential of the weighting floating gate is modulated to realize the weighting potential of the weighting floating gate. The interconnecting metal 211 is connected to the peripheral circuit 102 through a conductive via hole, and the on and off of the corresponding semiconductor channel 202 is controlled by the peripheral circuit 102.

In this embodiment, the material of the gate array 210 comprises copper. Specifically, first a Ta/TaN layer is formed in the gate window array 208 as a copper diffusion barrier layer, then a copper seed layer is formed on the surface of the Ta/TaN layer, and then, an electroplating method is used. The gate window array 208 is filled with copper, and finally the excess copper on the surface is removed by chemical mechanical polishing to form the gate array 210.

Specifically, as shown in FIG. 7b, the gate array 210 comprises a plurality of gate lines, and each gate line crosses a plurality of the semiconductor channels 202 at the same time. The structure of the gate array 210 can be completed by only one filling. The fabrication of the gate electrode on each semiconductor channel 202 can effectively improve the process efficiency and reduce the process difficulty.

Figure 8:
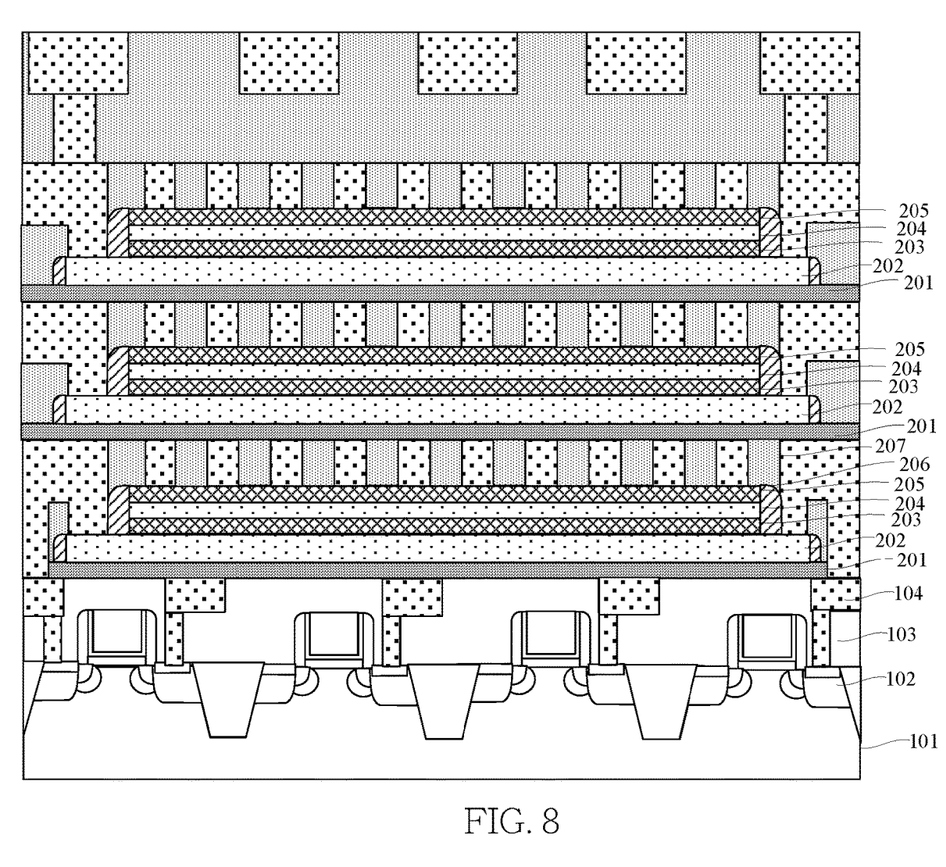

As shown in FIG. 8, finally perform step 7) which repeats steps 2) to 6) several times to form a multilayered neuron device structure. The invention realizes a neuron device structure arranged in an array on a plane and vertically stacked in the longitudinal direction and a manufacturing method thereof. The on and off of each neuron transistor in the neuron device structure is controlled by the peripheral circuit 102 in the substrate 101, that greatly improved the integration of neuron devices.

As shown in FIGS. 7a, 7b, and 8, this embodiment also provides a stacked neuron device structure, which includes a substrate 101, a barrier layer 201, and a neuron transistor array.

The substrate 101 has a peripheral circuit 102 therein. The material of the substrate 101 is selected from monocrystalline silicon, polycrystalline silicon or amorphous silicon; the substrate 101 may also be selected from silicon, germanium, gallium arsenide or silicon germanium compounds; A silicon structure on the layer; the substrate 101 may also be other semiconductor materials, which is not limited in the present invention. In this embodiment, the substrate 101 is made of silicon. The substrate 101 has a peripheral circuit 102, for example, the peripheral circuit 102 includes a plurality of peripheral components, such as NMOS, PMOS, CMOS, diodes, triodes, capacitors, etc. The circuit structure of the corresponding functions is composed of the above peripheral devices, such as SRAM, PLL, CPU, FPGA, etc., to realize the control of the structure of stacked neuron devices.

An insulating structure 103 and a conductive structure 104 in the insulating structure 103 are also formed on the substrate 101 for implementing the lead-out of the peripheral circuit 102.

The barrier layer 201 is located on the substrate 101. The barrier layer 201 is used on the one hand to isolate the semiconductor channel 202 from the conductive structure 104 underneath, on the other hand, it can prevent the diffusion of subsequently formed interconnection metals, such as copper, and improve the stability of the device. In this embodiment, the barrier layer 201 may be, but not limited to, a nitrogen-doped carbon oxide layer (NDC) or the like.

The neuron transistor array is located on the barrier layer 201 and comprises a plurality of neuron transistors arranged in an array; wherein, the neuron transistor includes a semiconductor channel 202, a modulation stack, and a gate array 210, The two ends of the semiconductor channel 202 are respectively connected to the peripheral circuit 102, and the peripheral circuit 102 controls the on and off of the corresponding neuron transistor. The modulation stack is located on the semiconductor channel 202, which comprises a first dielectric layer 203, a weighting floating gate layer 204, and a second dielectric layer 205 stacked in this order, the gate array 210 is located on the modulation stack, and is used to modulate the potential of the weighting floating gate, realize the weighting of the potential of the weighting floating gate.

In the neuron transistor array, a plurality of the neuron transistors are arranged in parallel, the gate array 210 comprises a plurality of gate lines, and each gate line is connected and cross to a plurality of semiconductor channels of the neuron transistors 202.

The two ends of the semiconductor channel 202 are respectively defined as a source region and a drain region, the conductivity types of the semiconductor channel 202, the source region and the drain region are all N-type, or the conductivity types of the semiconductor channel 202, the source region and the drain region are all P-type. The neuron transistor adopted by the invention adopts a junctionless transistor structure, on the one hand, it can avoid the implantation steps of the source region and the drain region, greatly reducing the difficulty of the process, on the other hand, the carrier can avoid incomplete interface between the gate oxidation layer and the semiconductor channel 202. Most carriers in the channel move within the semiconductor channel 202 instead of the surface. The carriers are limited by the influence of interface scattering, which improves the carrier mobility, reduces errors and increases the response speed of the device.

Two ends of the semiconductor channel 202 are exposed on both sides of the modulation stack, and the two ends are connected to the peripheral circuit 102 through a conductive via. The semiconductor channel 202 and the modulation stack have sidewall structures 206 on both sides. The sidewall structure 206 can prevent contact between the metal and the weighting floating gate layer 204 or the semiconductor channel 202.

The material of the semiconductor channel 202 comprises polysilicon, the material of the weighting floating gate layer 204 comprises polysilicon, the material of the first dielectric layer 203 comprises silicon dioxide, and the material of the second dielectric layer 205 comprises high k dielectric layer, such as alumina.

The material of the gate array 210 comprises copper. The gate lines of the gate array 210 are separated by an ultra-low-k dielectric layer 207. The dielectric constant of the ultra-low-k dielectric layer 207 is less than 2.5, and the isolation layer uses the ultra-low-k dielectric layer 207, which can effectively reduce the capacitance value between the gate lines in the subsequent gate array 210 to reduce the mutual influence between each gate lines to improve the accuracy of devices.

As shown in FIG. 8, the stacked neuron device structure further comprises a plurality of barrier layers 201 and neuron transistor arrays stacked alternately, and each of the neuron transistors in the neuron transistor array is connected to the peripheral circuit 102, and the corresponding neuron transistor is controlled to be turned on or off through the peripheral circuit 102.

As described above, the stacked neuron component structure and the manufacturing method thereof of the present invention have the following beneficial effects:

The invention realizes a neuron device structure arranged in an array on a plane and vertically stacked in the longitudinal direction and a manufacturing method thereof. The on and off of each neuron transistor in the neuron device structure is controlled by the peripheral circuit 102 in the substrate 101, that greatly improved the integration of neural components.

The neuron transistor adopted by the invention adopts a junctionless transistor structure, on the one hand, it can avoid the implantation steps of the source region and the drain region, greatly reducing the difficulty of the process, on the other hand, the carrier can avoid incomplete interface between the gate oxidation layer and the semiconductor channel 202. Most carriers in the channel move within the semiconductor channel 202 instead of the surface. The carriers are limited by the influence of interface scattering, which improves the carrier mobility, reduces errors and increases the response speed of the device.

Therefore, the present invention effectively overcomes various shortcomings in the prior art and has high industrial utilization value.

While various embodiments in accordance with the disclosed principles been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantage.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A stacked neuron device structure, comprising:
a substrate with peripheral circuits in the substrate;
a barrier layer on the substrate;
a neuron transistor array on the barrier layer, comprises a plurality of neuron transistors arranged in an array;
wherein the neuron transistor comprises a semiconductor channel, a modulation stack, and a gate array, and both ends of the semiconductor channel are respectively connected to the peripheral circuit, and the peripheral circuit is used to control on and off of the corresponding neuron transistor, the modulation stack is located on the semiconductor channel and comprises a first dielectric layer, a weighting floating gate layer and a second dielectric layer stacked sequentially, the gate array is located on the modulation stack, and is used to modulate the potential of the weighting floating gate to realize the weighting of the weighting floating gate,
wherein two ends of the semiconductor channel are exposed on both sides of the modulation stack, and the two ends are connected to the peripheral circuit through a conductive via, and
wherein both sides of the semiconductor channel and the modulation stack have sidewall structures.

2. The stacked neuron device structure according to claim 1, further comprising a plurality of barrier layers and neuron transistor arrays stacked alternately, and each of the neuron transistors in the neuron transistor array is connected to the peripheral circuit, and the peripheral circuit is used to control on and off of the corresponding neuron transistor.

3. The stacked neuron device structure according to claim 1, wherein in the neuron transistor array, a plurality of the neuron transistors are arranged in parallel, the gate electrode array comprises a plurality of gate lines, and each gate line is across to a plurality of semiconductor channels of the neuron transistors.

4. The stacked neuron device structure according to claim 1, wherein both ends of the semiconductor channel are defined as a source region and a drain region, the conductivity types of the semiconductor channel, source region and drain region are all N-type, or the conductivity types of the semiconductor channel, source region and drain region are all P type.

5. The stacked neuron device structure according to claim 1, wherein the semiconductor channel comprises polysilicon, the weighting floating gate layer comprises polysilicon, the first dielectric layer comprises silicon dioxide, and the second dielectric layer comprises high-k dielectric material.

6. The stacked neuron device structure according to claim 1, wherein the gate array comprises copper.

7. The stacked neuron device structure according to claim 1, wherein the gate lines of the gate array are isolated by an ultra-low-k dielectric layer.

8. A stacked neuron device structure, comprising:
a substrate with peripheral circuits in the substrate;
a barrier layer on the substrate;
a neuron transistor array on the barrier layer, comprises a plurality of neuron transistors arranged in an array;
wherein the neuron transistor comprises a semiconductor channel, a modulation stack, and a gate array, and both ends of the semiconductor channel are respectively connected to the peripheral circuit, and the peripheral circuit is used to control on and off of the corresponding neuron transistor, the modulation stack is located on the semiconductor channel and comprises a first dielectric layer, a weighting floating gate layer and a second dielectric layer stacked sequentially, the gate array is located on the modulation stack, and is used to modulate the potential of the weighting floating gate to realize the weighting of the weighting floating gate,
wherein both ends of the semiconductor channel are defined as a source region and a drain region, the conductivity types of the semiconductor channel, source region and drain region are all N-type, or the conductivity types of the semiconductor channel, source region and drain region are all P type.

9. The stacked neuron device structure according to claim 8, wherein the semiconductor channel comprises polysilicon, the weighting floating gate layer comprises polysilicon, the first dielectric layer comprises silicon dioxide, and the second dielectric layer comprises high-k dielectric material.

10. The stacked neuron device structure according to claim 8, wherein the semiconductor channel comprises polysilicon, the weighting floating gate layer comprises polysilicon, the first dielectric layer comprises silicon dioxide, and the second dielectric layer comprises high-k dielectric material.

11. A stacked neuron device structure, comprising:
a substrate with peripheral circuits in the substrate;
a barrier layer on the substrate;
a neuron transistor array on the barrier layer, comprises a plurality of neuron transistors arranged in an array;
wherein the neuron transistor comprises a semiconductor channel, a modulation stack, and a gate array, and both ends of the semiconductor channel are respectively connected to the peripheral circuit, and the peripheral circuit is used to control on and off of the corresponding neuron transistor, the modulation stack is located on the semiconductor channel and comprises a first dielectric layer, a weighting floating gate layer and a second dielectric layer stacked sequentially, the gate array is located on the modulation stack, and is used to modulate the potential of the weighting floating gate to realize the weighting of the weighting floating gate,
wherein the gate lines of the gate array are isolated by an ultra-low-k dielectric layer.

12. The stacked neuron device structure according to claim 11, wherein the gate array comprises copper.

* * * * *